United States Patent

Wu et al.

[11] Patent Number: 6,041,937
[45] Date of Patent: Mar. 28, 2000

[54] WAFER CASSETTE RETAINER IN A WAFER CONTAINER

[75] Inventors: Tzong-Ming Wu, Taipei; Gwo-Jou Huang, Hsinchu, both of Taiwan

[73] Assignee: Industrial Technology Research Institute, Hsinchu, Taiwan

[21] Appl. No.: 09/326,487

[22] Filed: Jun. 4, 1999

Related U.S. Application Data

[63] Continuation of application No. 09/087,323, May 29, 1998, abandoned.

[51] Int. Cl.⁷ .............................. B65D 85/30; B65D 81/05
[52] U.S. Cl. ......................... 206/710; 206/453; 206/454; 206/586; 206/591
[58] Field of Search ...................................... 206/710, 711, 206/453, 454, 832, 591, 592, 586; 267/164

[56] References Cited

U.S. PATENT DOCUMENTS

| | | | |
|---|---|---|---|
| 3,109,639 | 11/1963 | Nicolaisen | 206/591 X |
| 3,236,513 | 2/1966 | Nicolaisen | 206/591 X |
| 3,934,733 | 1/1976 | Worden | 206/454 X |
| 4,007,837 | 2/1977 | Rowley et al. | 206/454 X |
| 4,061,228 | 12/1977 | Johnson | 206/454 |
| 4,582,219 | 4/1986 | Mortensen et al. | 206/454 X |
| 4,747,488 | 5/1988 | Kikuchi | 206/454 X |
| 4,869,479 | 9/1989 | Colonel et al. | 267/169 X |
| 5,025,929 | 6/1991 | Watanabe | 206/711 X |
| 5,207,324 | 5/1993 | Kos | 206/711 |
| 5,270,482 | 12/1993 | Kos | 206/711 X |
| 5,273,159 | 12/1993 | Gregerson | 206/711 |
| 5,320,225 | 6/1994 | Kirkpatrick | 206/454 X |
| 5,555,981 | 9/1996 | Gregerson | 206/711 |
| 5,743,409 | 4/1998 | Nakahara et al. | 206/710 |
| 5,749,467 | 5/1998 | Greyerson | 206/711 X |

*Primary Examiner*—Bryon P. Gehman
*Attorney, Agent, or Firm*—Pro-Techtor International Services

[57] ABSTRACT

A wafer cassette retainer to be used in a wafer container including a box top with an upper inner side for positioning a wafer cassette therein. The wafer cassette retainer comprises: a fixed part, mounted on the upper inner side of the box top; and an elastic part, attached to the fixed part from below. The elastic part has several elastic plates, which form a rhomboid, and a lower side with a contact arc for contacting the wafer cassette. The elastic part is elastic against vertical deformation and is deformed by contacting the wafer cassette within the wafer container, thus holding the wafer cassette securely, independent of size and shape thereof, and absorbing shocks thereon. For increased elasticity of the elastic part, additional grooves are cut into inner corners of two opposite lateral joints between the elastic plates.

3 Claims, 4 Drawing Sheets

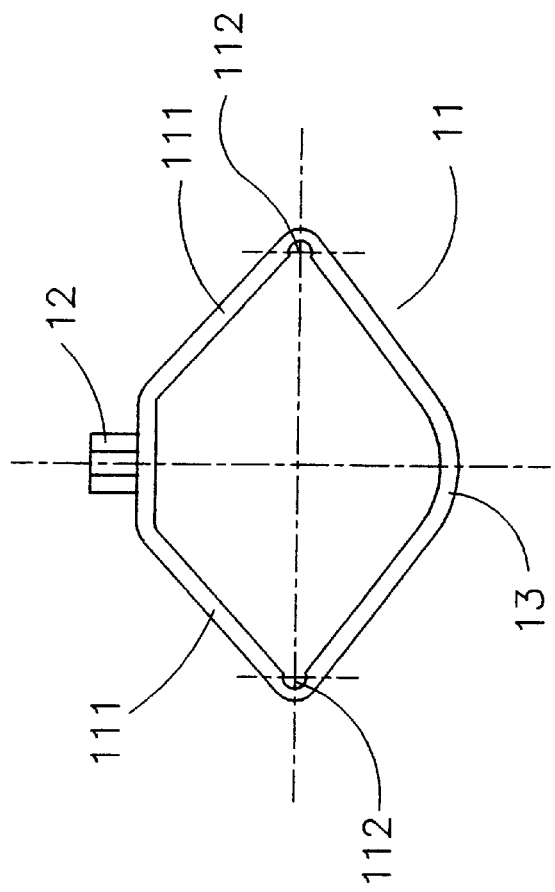
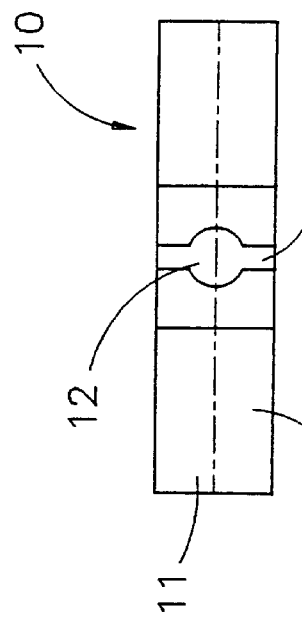
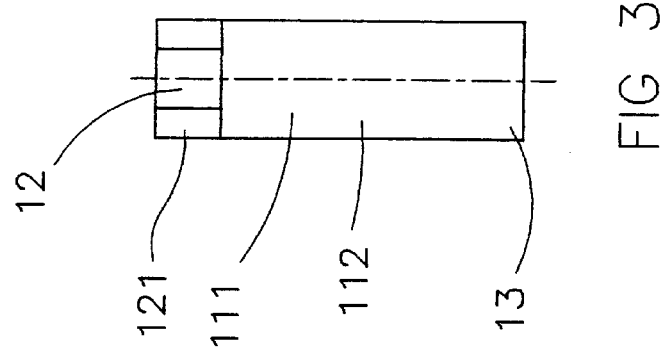

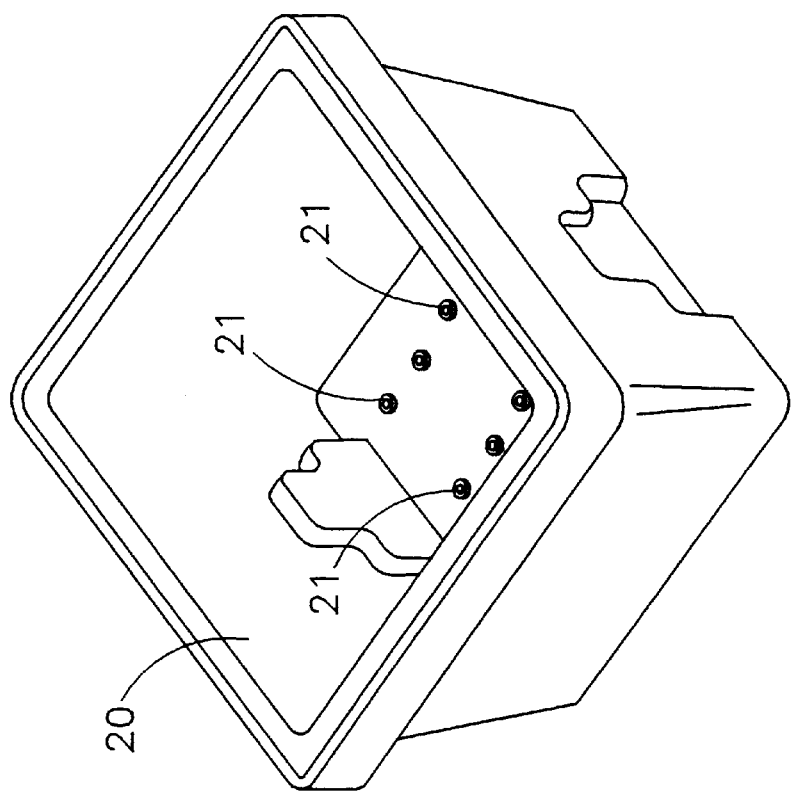
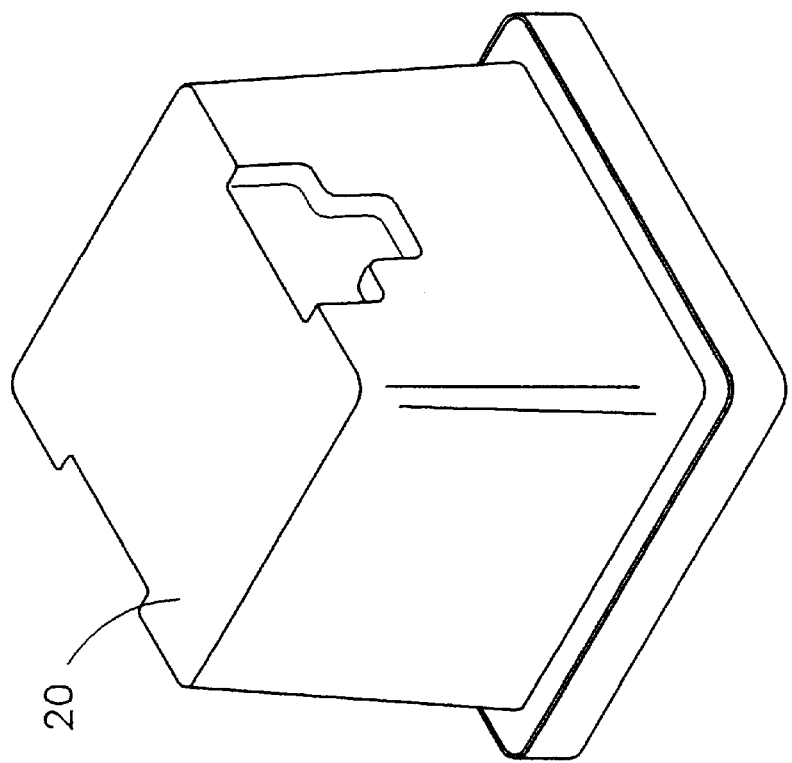

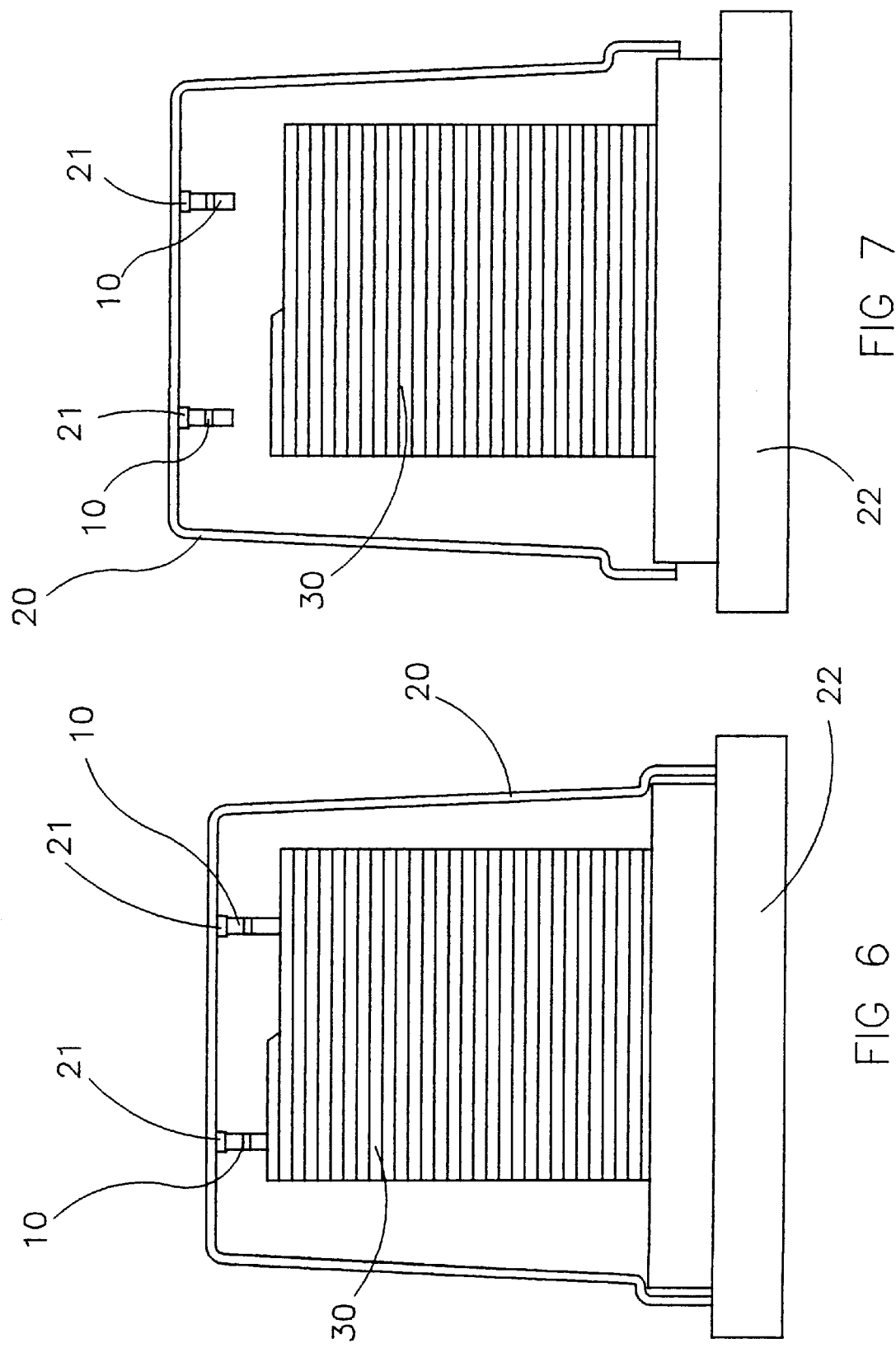

WAFER CASSETTE RETAINER IN A WAFER CONTAINER

This is a continuation application of applicant's U.S. patent application Ser. No. 09/087,323, filed on May 29, 1998, now abandoned.

FIELD OF THE INVENTION

The present invention relates to a wafer cassette retainer, particularly to a wafer cassette retainer with a flexible shape for adapting to wafer cassettes of various sizes and shapes.

DESCRIPTION OF RELATED ART

Wafer cassettes for circular semiconductor wafers are produced in various forms, e.g. with or without projections, and sizes. Therefore retainers are needed to fix wafer cassettes within a wafer container.

The main function of a wafer cassette retainer is to provide a secure seat for a wafer cassette when the box top of a wafer container is put on the box base thereof and to absorb shocks during transport of the wafer cassette. However, a conventional wafer cassette retainer, as disclosed in U.S. Pat. No. 4,739,882, is usable in wafer cassettes of a certain, fixed size only, thus having a limited effect for absorbing shocks. Furthermore, the shape of a conventional wafer cassette retainer is complicated, and dust particles are easily attracted.

The wafer cassette retainer taught in the U.S. patent mentioned above and produced by the Asyst company is designed for 8-inch (200 mm) wafers and has a top liner which is shaped by vacuum forming and mounted on the box top. When sitting on a box base the top liner presses against the wafer cassette on two points from above, fixing the wafer cassette on the box base. However, since the wafer cassette retainer is not flexible, any change in the geometry of the wafer cassette requires exchanging the retainer. What is more, shocks are not effectively absorbed by such the retainer. The wafer cassette retainer is therefore of limited use.

SUMMARY OF THE INVENTION

It is therefore the main object of the present invention to provide a wafer cassette retainer of flexible geometry for accommodating wafers of various sizes and shapes and for effective absorbing of shocks.

Another object of the present invention is to provide a wafer cassette retainer of simple shape, which does not attract dust particles.

The present invention can be more fully understood by reference to the following description and accompanying drawings.

BRIEF DESCRIPTION OF THE DRAWINGS

FIGS. 1–3 are views from three sides of the wafer cassette retainer of the present invention.

FIGS. 4 and 5 are perspective views from above and below of a box top of a wafer cassette in conjunction with the wafer cassette retainer of the present invention.

FIGS. 6 and 7 are schematic illustrations of how the wafer cassette retainer of the present invention is mounted on the box base.

DETAILED DESCRIPTION OF THE PREFERRED EMBODIMENT

Figure 8:
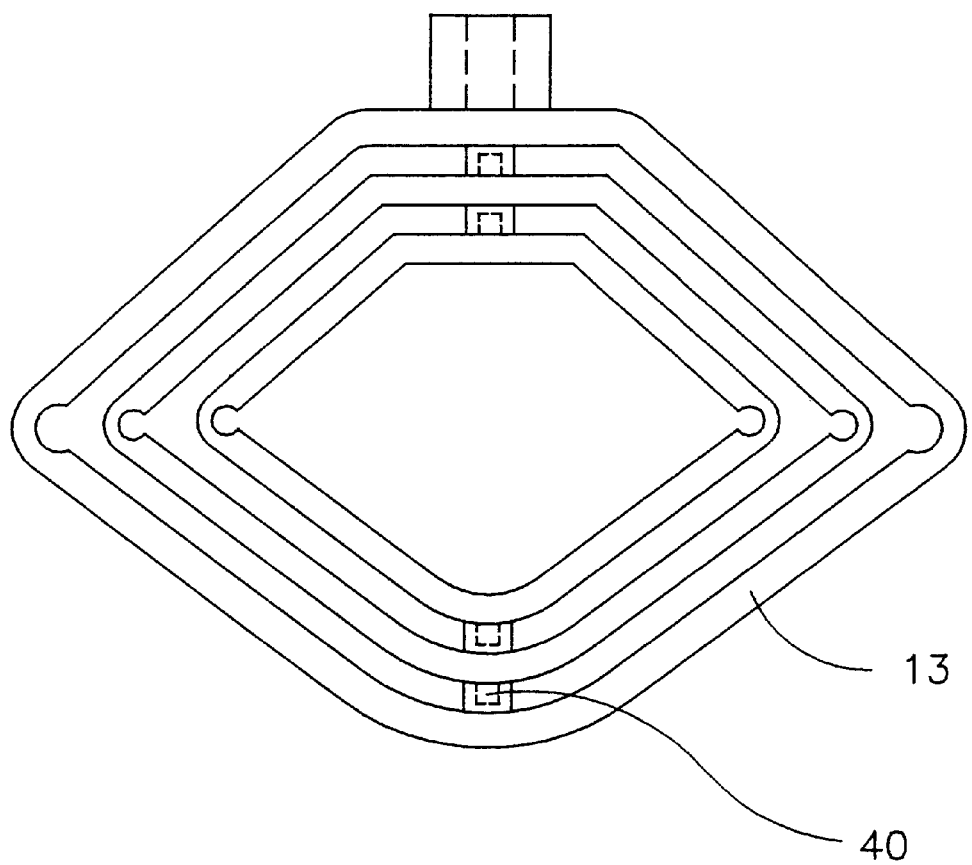
FIGS. 8 and 9 are schematic illustrations of using multiple wafer cassette retainers of the present invention.

The wafer cassette retainer of the present invention is used in a wafer container including a box top 20 and a box base 22 for positioning a wafer cassette 30 therein.

As shown in FIGS. 1–3, the wafer cassette retainer 10 of the present invention is a single body of flexible material, mainly consisting of an elastic part 11 and a fixing part 12. The elastic part 11 has four spring plates 111, which together form a rhombus with an upper corner, a lower corner and two lateral corners. Two grooves 112 are cut into the inner sides of the lateral corners of the rhombus to enhance the elasticity of the elastic part 11.

The elastic part 11 has a contact arc 13 on the lower corner for contacting the wafer cassette 30 on the upper side thereof. The fixing part 12 is mounted on the inner side of the box top and is shaped like a short, vertical cylinder with two lateral extensions 121 extending outward in opposite directions. The lateral extensions 121 prevent the fixing part 12 from rotating around the vertical axis, when inserted into the box top.

When the wafer cassette 30 has been laid into the wafer container, the contact arc 13 contacts the wafer cassette 30 on the upper side thereof. The elastic part 11 is then vertically deformed, developing an elastic force, such that the contact arc 13 presses on the wafer cassette 30, preventing vibrations thereof.

Referring to FIGS. 4 and 5, the box top 20 has an inner side with wafer cassette retainer receiving sockets 21. One socket 21 takes in the fixing element 12 of one wafer cassette retainer 10. Each socket 21 has an annular wall with an inner diameter that is equal to the cross-section of the fixing element 12, allowing the fixing element 12 to be received in the socket 21 and to be prevented from rotating therein.

Referring to FIG. 6, after mounting the wafer cassette retainers 10 in the box top 20, for each wafer cassette retainer 10 the flexible part 11 points downward. As shown in FIG. 7, the wafer cassette 30 is laid on the box base 22, and the box base 22 with the wafer cassette 30 is inserted into the box top 20 from below, such that for each wafer cassette retainer 10 the wafer cassette 30 touches the lower corner of the flexible part 11. When the wafer container is just closed, with the box base 22 starting to seal the box top 20, the contact arc 13 of each wafer cassette retainer 10 touches the upper side of the wafer cassette 30. Complete closing of the wafer container causes each wafer cassette retainer 10 to be elastically deformed, thus developing downward pressure on the wafer cassette 30. The wafer cassette 30 is then stably positioned on the box base 22.

Figure 9:
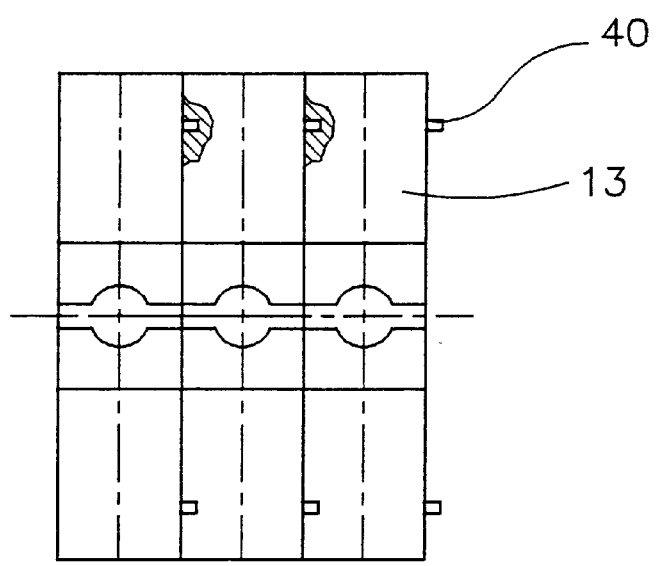

The wafer cassette retainer 10 of the present invention is made of plastic or another elastic material with a suitable elastic coefficient. Depending on the shape of the wafer cassette 30, one or several wafer cassette retainers 10 are used. Several wafer cassette retainers 10 are combined in series, as shown in FIG. 8, or in parallel, as shown in FIG. 9. Connecting elements 40, like pins or hooks, on the elastic plates 111 or the contact arcs 13 connect several wafer cassette retainers 10. Thus any required elasticity is obtained.

The wafer cassette retainer 10 of the present invention allows for a large elastic displacement of the elastic element 11, accommodating large variations in the size of the wafer cassette 30. Thus wafer cassettes 30 of many sizes and shapes are held securely in the wafer container. Furthermore, due to the elasticity against vertical deformation of the elastic element 11 in the wafer cassette retainer 10 of the present invention effectively shocks and vibrations to which the wafer cassette 30 may be exposed are effectively absorbed.

The wafer cassette retainer 10 of the present invention has a simple form and a small surface, which do not attract dust particles. Therefore a clean environment for the wafers in the wafer cassette 30 is preserved.

While the invention has been described with reference to a preferred embodiment thereof, it is to be understood that modifications or variations may be easily made without departing from the spirit of this invention which is defined by the appended claims.

What is claimed is:

1. A wafer cassette retainer in combination with a wafer container comprising:

a fixing part that projects upward from said wafer cassette retainer and is received in a socket in an upper inner side of the container, said socket comprises an annular wall extending downward from the upper inner side of the container; and an elastic part having a plurality of segments that form a closed geometric figure, said elastic part includes an upper side which is attached to said fixing part, and a lower side with a contact arc for contacting in a single elongated line of contact a wafer cassette contained in the wafer container, wherein said elastic part is deformed by contacting the wafer cassette within the wafer container, thereby holding the wafer cassette securely and absorbing shocks thereon.

2. The wafer cassette retainer according to claim 1, wherein:

said closed geometric figure of said elastic part has two joints with inner corners, said inner corners each include a groove therein to increase elasticity of said elastic part.

3. The wafer cassette retainer according to claim 1, wherein:

said wafer cassette retainer further comprises at least one connecting element to removably connect said wafer cassette retainer to other similar units of the wafer cassette retainer in either serial or parallel configurations, said at least one connecting element comprising a projection extending outward from a first surface of said elastic part and a receiving aperture in a second surface of said elastic part.

\* \* \* \* \*